United States Patent [19]
Yamada

[11] Patent Number: 5,737,697
[45] Date of Patent: Apr. 7, 1998

[54] TRANSMISSION POWER CONTROL CIRCUIT FOR A COMMUNICATION SYSTEM

[75] Inventor: Tatsuya Yamada, Hino, Japan

[73] Assignee: Toshiba Corporation, Kanagawa-ken, Japan

[21] Appl. No.: 464,828

[22] PCT Filed: Jan. 21, 1994

[86] PCT No.: PCT/JP94/00073

§ 371 Date: Jul. 10, 1995

§ 102(e) Date: Jul. 10, 1995

[87] PCT Pub. No.: WO94/17598

PCT Pub. Date: Aug. 4, 1994

[30] Foreign Application Priority Data

Jan. 25, 1993 [JP] Japan ............... 5-009922

[51] Int. Cl.[6] ............... H04B 1/04
[52] U.S. Cl. ............... 455/126; 455/127; 330/279
[58] Field of Search ............... 455/126, 127; 330/129, 279

[56] References Cited

U.S. PATENT DOCUMENTS 5,438,683  8/1995  Durtler et al. ............... 455/126
5,507,016  4/1996  Okuhara ............... 455/126

FOREIGN PATENT DOCUMENTS 60-126925   7/1985  Japan.
62-278823  12/1987  Japan.
 1-7719     1/1989  Japan.
 1-98304    4/1989  Japan.

*Primary Examiner*—Chi H. Pham
*Attorney, Agent, or Firm*—Finnegan, Henderson, Farabow, Garrett & Dunner, L.L.P.

[57] ABSTRACT

A communications system free from overshooting of the transmission power. A capacitor (C1) is charged with a power setting signal (Cc) during a period from time t1 to t2 within a time slot (Tm) in which a transmission is started and keeps the charged voltage, which controls the transmission power Po at the beginning of the time slot (T1).

28 Claims, 17 Drawing Sheets

TRANSMISSION POWER CONTROL CIRCUIT FOR A COMMUNICATION SYSTEM

TECHNICAL FIELD

The invention relates to communications systems which are available for digital mobile communications systems and which prevent the transmission power from overshooting at the beginning of transmission or at the time of changing the transmission power to a lower level.

BACKGROUND ART

Conventionally, cellular digital mobile communications systems have been adopting a TDMA (time division multiple access) method. In the TDMA method, transmission and reception between communications systems utilizing the method are carried out in a time slot associated with the transmission and reception frequency, which is so cold intermittent transmission (or burst transmission) in which stabilization of the transmission power is promoted.

Specifically, the field strength received at a cell base station receiving a transmitted radio wave from a mobile station varies as the mobile station moves within a cell, and accordingly the level of the transmission power from the mobile station is controlled so that it is changed on the basis of an instruction signal from the cell base station. For example, if a mobile station is near from the base, the transmission power of the mobile station is lowered so as to avoid input saturation (cross modulation) caused by a strong electric field at the cell base station receiving a transmission radio wave from the mobile station.

If a mobile station is far from the base, the transmission power of the mobile station is raised so as to make higher the field strength received by the cell base station receiving the transmitted radio wave from the mobile station to maintain a stable reception state. Further, in a mobile station, after having its level controlled, the transmission power is controlled by means of a closed loop so as to make its level constant, preventing the transmission power from changing. Specifically, when the transmission power of the mobile station is comparatively high, a fall in the output power caused by calorification of last-stage power amplifier devices and a variation in the power supply voltage is checked to keep a stable transmission state in a radio circuit formed between the mobile station and the cell base station.

FIG. 1 is a block diagram showing a structure of a conventional communications system in which the transmission power is closed-loop-controlled. In FIG. 1, a radio transmission signal Pa is received in the communications system and is fed through an input terminal 1 to a variable-gain circuit 2. A power amplifier 3 outputs a transmission power Po which is an amplified version of the radio transmission signal Pa from the variable-gain circuit 2. The transmission power Po from the power amplifier 3 is sent to an antenna 6 through a branch circuit 4, such as a directional coupler, adapted to make a signal branch and a multiplexer 5 for sharing the antenna. The transmission power Po is sent out from the antenna 6 as radio wave On the other hand, radio wave Wb from the cell base station (not shown) is received at the antenna 6 to provide a receive signal, which is input to a receiving portion 10 through the multiplexer 5. In the receiving portion 10, frequency conversion, demodulation, etc. are performed to provide a demodulated signal. The demodulated signal includes transmission power change instruction information Sa for specifying the level of the transmission power from the mobile station carrying this system on the basis of the field strength at the time when the cell base station received radio wave Wa from the mobil station. The transmission power change instruction information Sa is fed to a controller 12 including a CPU etc. Also, a branch circuit 4 makes the transmission power Po branch and feed a detector circuit 7. The detector circuit 7 envelope detects a high frequency signal which has branched off at the branch circuit 4, and applies a detected signal Sb exhibiting the level of the high frequency signal to an input terminal of an error amplifier 8.

Also, supplied from a D/A converter 13 to the other input terminal of the error amplifier 8 is an analog reference voltage Sc for use in gain-controlling the transmission power Po in the variable gain circuit 2, on the basis of the transmission power change instruction information Sa fed from the receiving portion 10. The error amplifier 8 provides a difference sinal based on the difference between the detected signal Sd and the reference voltage Sc applied to its two input terminals. The difference signal is fed to a loop filter, where it has its noise removed and is smoothed to feed a sample-hold (S/H) circuit 11. Also fed to the S/H circuit 11 are sampling pulses Cp synchronous with transmission time slots from the controller 12. In the S/H circuit 11, a switch (not shown) is shifted to a conductive state in synchronism with the time slots associated with the system to permit flow of the difference signal from the loop filter 9 and shifted to a nonconductive state in synchronism with the time slots associated with the other time slots to stop feeding the difference signal from the loop filter 9.

In the nonconductive state, a capacitor provided in the S/H circuit 11 is charged with the difference signal from the loop filter 9 to hold a discharged voltage, which is applied, as a control voltage, to a control terminal of the variable-gain circuit 2 to control its gain. Specifically, if the voltage of the detected signal Sb fed to a terminal of the error amplifier 8 is higher than the voltage which is fed to the other input terminal and based on the transmission power change instruction information Sa, the gain of the variable-gain circuit 2 is lowered to reduce the transmission power Po from the power amplifier 3. Otherwise, the gain Of the variable-gain circuit 2 is raised to increase the transmission power Po from the power amplifier 3.

Thus, the transmission power Po supplied from the power amplifier 3 is adjusted according to the transmission power change instruction information Sa by controlling the gain of the variable-gain circuit 2. The adjusted transmission power Po is further closed-loop-controlled to maintain a predetermined value. In controlling the transmission power by means of a closed loop, the transmission power would overshoot, or rise exceeding, the normal value, at the rising edge of the time when a transmission operation begins (hereinafter referred to as "at the beginning of transmission") and at the time of changing the transmission power to a lower level. That is, since the detected signal Sb can not be obtained from the detector circuit 7 at the beginning of transmission, the difference signal from the error amplifier 8 causes the gain of the variable-gain circuit 2 to be controlled through the loop filter 9 and the S/H circuit 11 to become the maximum.

Thus, it becomes impossible to control the transmission power by means of a closed loop. If a transmission is started in such an arrangement, the transmission power Po will be provided in its maximum value and thereafter controlled by means of a closed loop based on the detected signal Sb to converge on a target value. In this case, the convergence time is determined by the time constant of the receiving portion 10 and the overshooting will continue till the convergence.

FIGS. 2(a)–(d) are timing charts for the signals related to operation of the structure shown in FIG. 1. In FIGS. 1 and 2(a)–(d), are time slots for transmission of the system is, among the time slots, identified as T1, T2, . . . as shown in FIG. 2(a). In response to the transmission time slots, sampling pulses Cp as shown in FIG. 2(d) are supplied from the controller 12 to the S/H circuit 11. The sampling pulses Cp cause the S/H circuit 11 to supply a transmission power control signal Vc as shown in FIG. 2(b) to the variable-gain circuit 2. The transmission power control signal Vc has a high voltage at the beginning of the time slot T1 in the initial stage of the beginning of transmission.

Thus, in the first time slot T1, the transmission begins at time t0 and at this time the closed loop is out of control, causing the transmission power Po to become larger than, or overshoot, a target value. The overshooting occurs at the time of changing the transmission power Po to a low level as well as at the beginning of transmission. Specifically, a capacitor (not shown) in the S/B circuit 11 has been charged with a large value of the transmission power Po till last slot to have a transmission power control signal Vc, and when the transmission power Po is changed to a lower level, the transmission power control signal Vc is applied to the variable-gain circuit 2, causing an overshooting to continue till the closed loop control with respect to the low level to which the transmission power Po has been changed converges.

The overshooting causes the power amplifier 3 to output a large transmission power Po, which may result in an adverse effect such as cross modulation at time slots for reception other than the time slots T1, T2, . . . Further, it is necessary to use, for the power amplifier 3, semiconductor devices capable of producing a large .transmission power Po. Calorification by the power amplifier 3 increases in calorie. Furthermore, the branch circuit 4 and the multiplexer 5 have to have a tolerance to a large electric power, which results in a large size of the system. If elements with a low withstand power were used for the power amplifier 3, the branch circuit 4 and the multiplexer 5 in order to reduce the system size, then these elements would easily deteriorate.

This invention is directed to solving these and other problems and advantages of the prior art. Briefly according to the invention, there is introduced a communications system which prevents the transmission power from overshooting at the beginning of transmission and at the time of changing the transmission power to a lower level thereby to reduce the withstand power of the transmission power path and to check an adverse effect on reception which would be otherwise caused by the overshooting.

DISCLOSURE OF THE INVENTION

The above and other object of the invention are achieved by the invention which relates to radio communication apparatus.

According to a first aspect of the invention, a radio communication apparatus transmitting a signal for a transmit period has variable power amplifying means for producing a transmission power in response to a control voltage, detecting means for detecting the level of the transmission power supplied from the variable power amplifying means, reference voltage generating means for generating a reference voltage for controlling the level of the transmission power from the variable power amplifying means, comparing means for comparing the detected level with the reference voltage to output a difference signal, control means for controlling an output level of the variable power amplifying means by use of the difference signal sent from the comparing means, control voltage setting means for providing a compensation signal which flows, through a closed loop made of the variable power amplifying means, the detecting means, the comparing means, and the control means, so as to set the control voltage at such a value as not to increase a transmission power from the variable power amplifying means, before the transmit period.

BRIEF DESCRIPTION OF THE DRAWINGS

The above and other objects and aspects of the present invention will be apparent from the following description of the preferred embodiments of the invention with reference to the accompanying drawings. It is to be expressly understood, however, that the embodiments shown in the drawings are for the purpose of illustration and better understanding only and are not intended as definitions of the limits of the invention. In the drawings.

BEST MODE FOR CARRYING OUT THE INVENTION

Referring to FIG. 3 through 17, communications systems according to preferred embodiments will be presented in the following.

Figure 3:
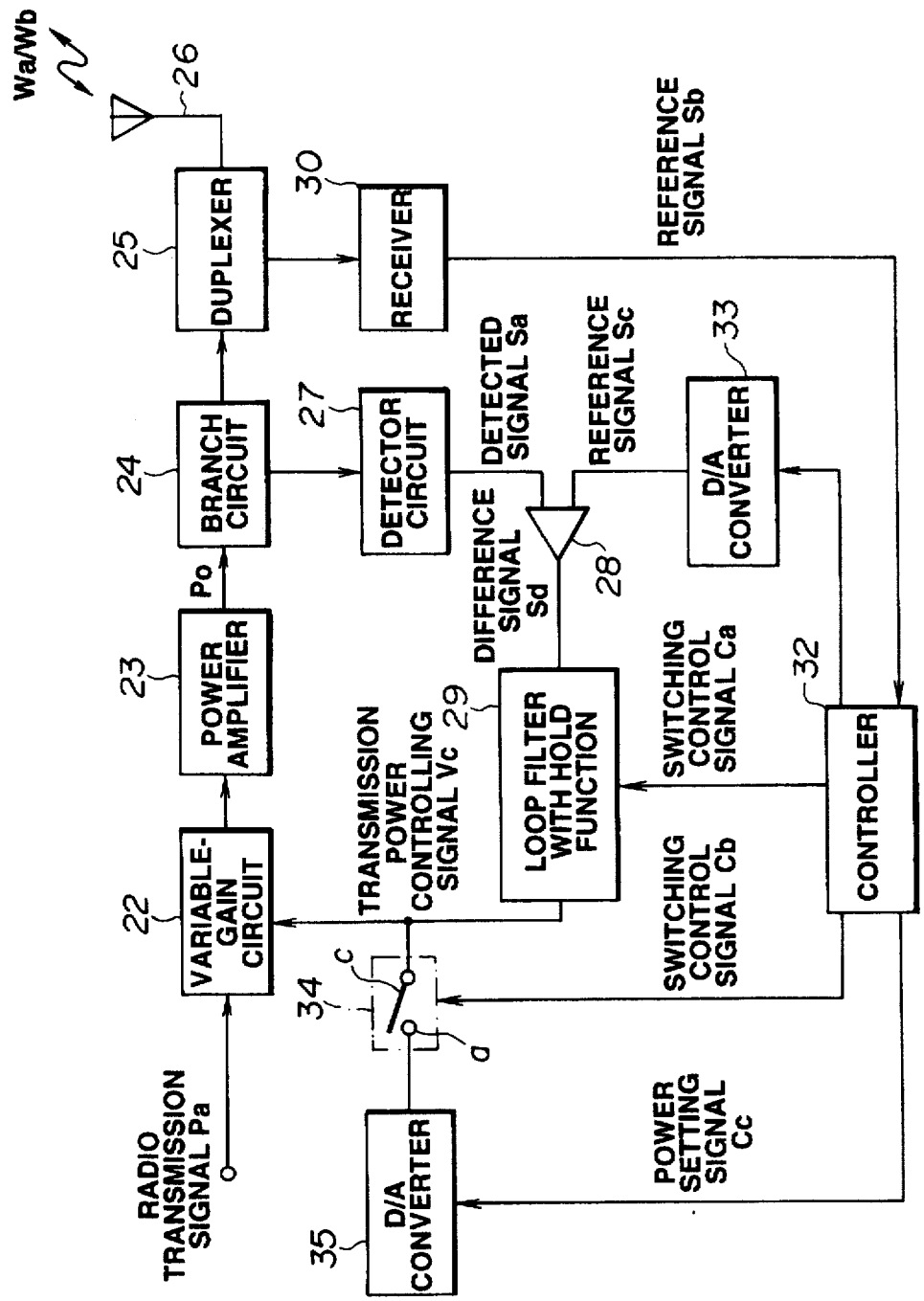
FIG. 3 is a block diagram showing a structure of a communications system according to a first illustrative embodiment of the invention.

FIG. 3 is a block diagram showing a structure of a communications system according to a first illustrative embodiment of the invention. In FIG. 3, the communications system comprises: a variable gain circuit 22 for adjusting and supplying a input radio transmission signal Pa on the basis of a transmission power controlling signal Vc; a power amplifier 23 for amplifying the radio transmission signal from the variable-gain circuit 2 to producing a transmission power Po; a branch circuit 24, e.g., a directional coupler, for making the transmission power Po branch; a multiplexer for sharing an antenna between transmission and reception; an antenna for transmitting and receiving radio waves Wa and Wb to and from, for example, a cell base station (not shown) over radio circuits; a detector circuit 27 for envelope detecting a high frequency signal which has branched off from the transmission power Po at the branch circuit 4 and producing a detected signal Sb representative of the level of the high frequency signal; an error amplifier 28 for having one input terminal fed with a voltage of the detected signal Sb from the detector circuit 27 and the other input terminal fed with a reference voltage Sc for controlling the gain of the variable-gain circuit 22 to yield a transmission power Po based on a transmission power change instruction information Sa from a cell base station as described in detail later and for supplying a difference signal Sd between them; a loop filter with hold function; a receiving portion 30 for demodulating a received signal received from, for example, a cell base station through a radio circuit, the antenna 26 and the multiplexer 25 and for supplying a transmission power change instruction information Sa, sent from a cell base station for instance, for specifying the level of the transmission power; a controller 32 operative on the basis of the transmission power change instruction information Sa from the receiving port/on 30 for supplying switching control signals Ca and Cb for specifying the level of the transmission power; a D/A converter 33 for making analog a reference voltage Sc based on the transmission power change instruction information Sb from the controller 32 and applying the D/A converted reference voltage Sc to the other input terminal of the error amplifier 28 an analog switch 34 to a movable contact "c" of which the transmission power controlling signal Vc from the loop filter with hold function 29 is applied; and a D/A converter 35 for making analog a power setting signal Cc supplied from the controller 32 and intended to set a target value to the transmission power Po and applying the D/A converted power setting signal to a stationary contact "a" of the analog switch 34.

Now, we explain a detailed structure of the loop filter with hold function shown in FIG. 3.

Figure 4:
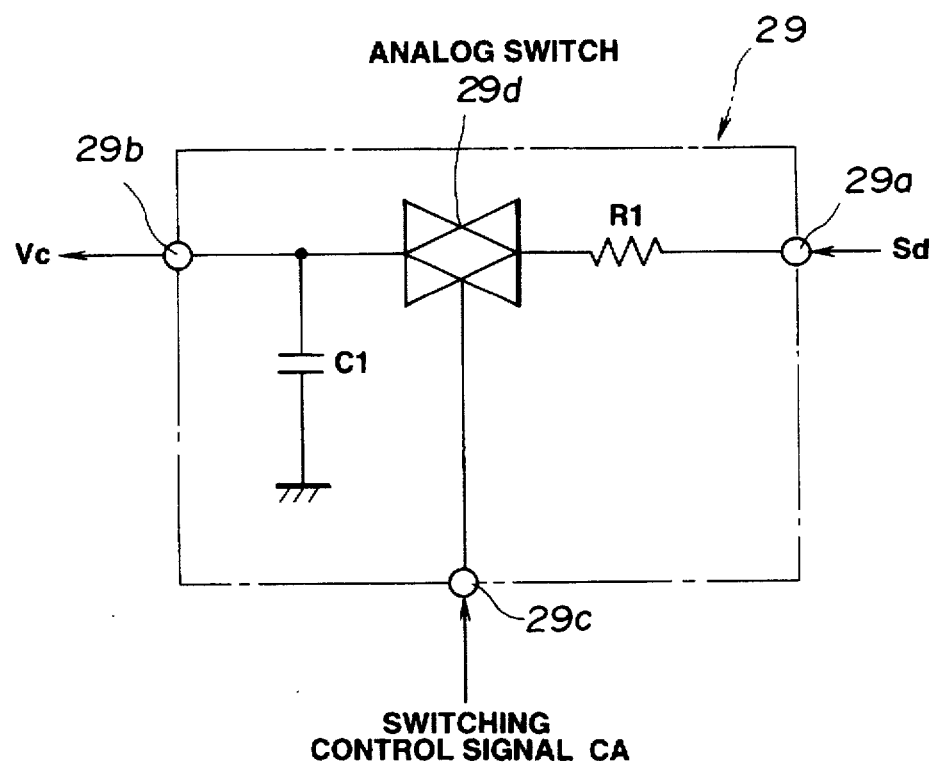
FIG. 4 is a circuit diagram showing a detailed structure of a loop filter with hold function as shown in FIG. 3.

FIG. 4 is a circuit diagram showing the detailed structure of the loop filter with hold function shown in FIG. 3. In FIG. 4, the loop filter with hold function 29 is a combination of a conventional sample-hold circuit and loop filter and has an input terminal 29a, connected to the output of the error amplifier 28, to which the difference signal is input and an output terminal 29b connected to a control terminal of the variable-gain circuit 22 and the movable contact "c" of the analog switch 34 and adapted to output the transmission power controlling signal Vc. The loop filter with hold function 29 is further provided with a control terminal 29c connected to the controller 32 and adapted to receive the switching control signal Ca, an analog switch 29d provided between the input terminal 29a and the output terminal 29b and adapted to be in a conductive or on state in case of the switching control signal Ca being at a high level and in a nonconductive or OFF state in case of the switching control signal Ca being at a low level, a capacitor C1 which is disposed between the output terminal 29b and the ground and which is charged with a D/A converted power setting signal Cc from the D/A converter 35 to hold a voltage if the analog switch 29d is off because of a high load impedance and the analog switch 34 is on, and a resistor R1 connected between the input terminal 29a and the analog switch 29d to constitute, together with the capacitor C1, a RC (resistor and capacitor) low pass filter in case of the conductive state of the analog switch.

Operation in the structure according to the first embodiment will be presented in the following.

FIGS. 5(a)–(e) are timing charts showing the timing of signals processed in operation in the structure according to the first embodiment. The system performs a transmissions in each of the transmission time slots T1, T2 . . . as shown in FIG. 5(a). In this operation, as shown in FIG. 5(e), the controller 32 outputs a high level switching control signal Cb in a period from time t1 to t2 in the time slot Tm before the transmission time slot T1 when a transmission is started, causing the analog switch 34 to turn on. In this case, the switching control signal Ca supplied from the controller 32, which is at a low level, is applied to the analog switch 29d via the control terminal 29c of the loop filter with hold function 29, which causes the analog switch 29d to turn off. Thus, the transmission power controlling signal Vc becomes equal in voltage to the D/A converted power setting signal Cc because the output impedance of the D/A converter 35 is low.

The transmission power controlling signal Vc is applied to the control terminal of the variable-gain circuit 2 so that the transmission power Po from the variable-gain circuit 2 is set for a target value. At the same time, the capacitor C1 is charged with the D/C converted power setting signal Cc to hold a charged voltage. After the completion of charging of the capacitor C1, the switching control signal Cb becomes a low level at time t2 in the time slot Tm, causing the analog switch 34 to turn off. Subsequently, at the rising time t3 of transmission time slot T1, the switching control signal Ca from the controller 32 becomes a high level, which is maintained during the tome slot T1 and which makes the analog switch 29d in the loop filter 29 turn on. In a turned-on state of the analog switch 29, a closed loop control is carried out. Specifically, the error amplifier 28 compares the reference voltage Sc based on the transmission power change instruction information Sb for specifying the level of the transmission power and the voltage of the detected signal Sb from the detector circuit 27 to output the resultant difference signal Sd to the loop filter with hold function 29, where the reference signal Sd is rid of noise and smoothed by the RC low pass filter which is formed by the turned-on analog switch 29 connecting the resistor R1 and the capacitor C1 to yield the transmission power controlling signal Vc. The signal Vc is applied to the control terminal of the variable-gain circuit 22, where the gain of the circuit 22 is controlled according to the signal Vc, which causes the transmission power Po from the power amplifier 23 to be set to a target value based on the transmission power change instruction information Sa.

In this case, the charged voltage of the loop filter with hold function 29 is applied, at the rising edge of the transmission time slot T1, to the control terminal of the variable-gain circuit 2 as the transmission power controlling signal Vc, which then controls the gain of the variable-gain circuit 22 so as to set the transmission power Po from the power amplifier 23 to the target value. Thus, overshooting no longer occurs at the beginning of an active period of the transmission power Po as shown in FIG. 5(c). Further, since the error of the transmission power controlling signal Vc is so small at the beginning of the transmission time slot T1 that the transmission power Po converges rapidly to the target value in the time slot T1.

Now, a second illustrative embodiment of the invention will be presented in the following.

Figure 1:
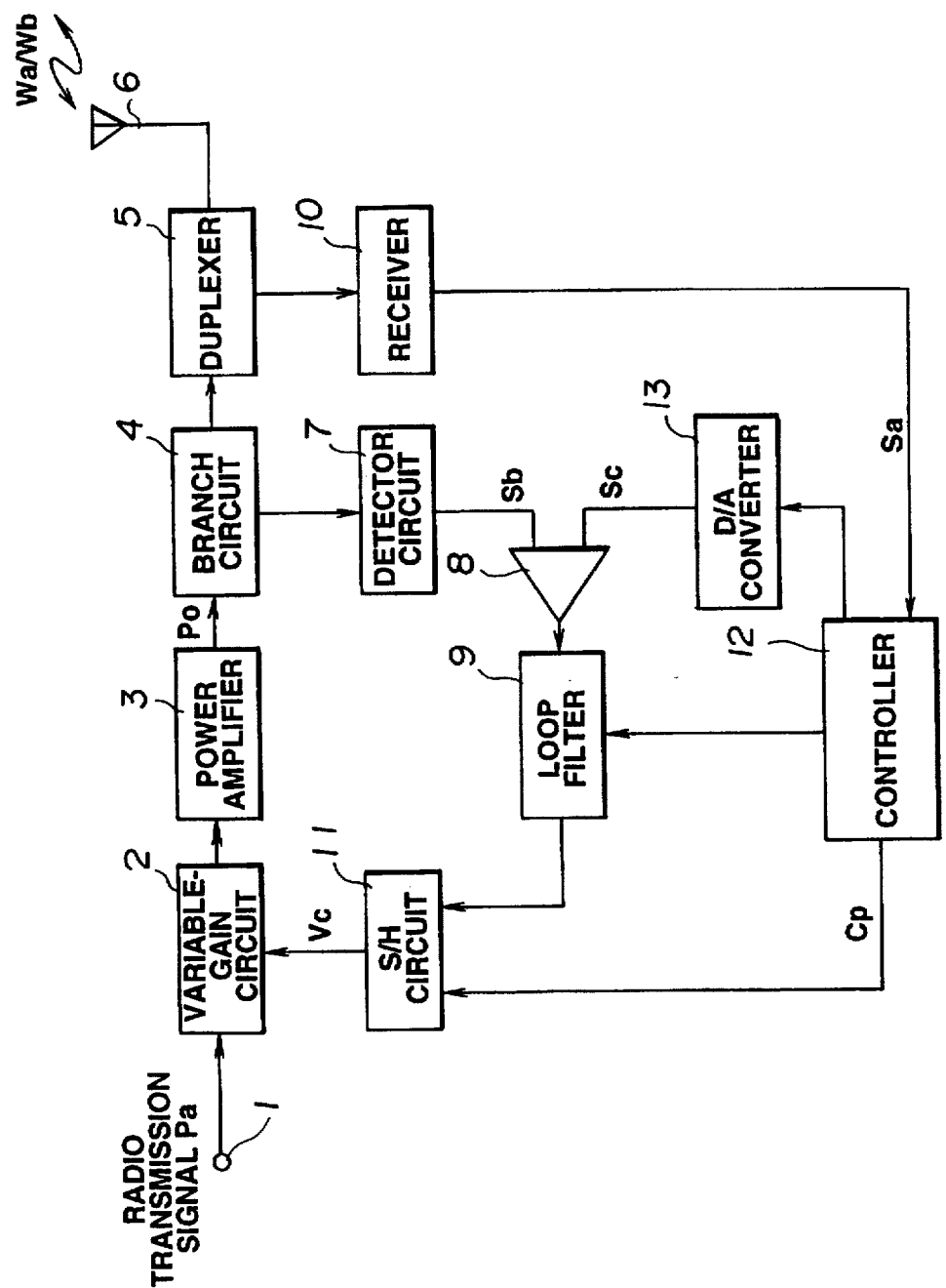
FIG. 1 is a block diagram showing a structure of a conventional communications system in which the transmission power is closed loop controlled.
Figure 2:
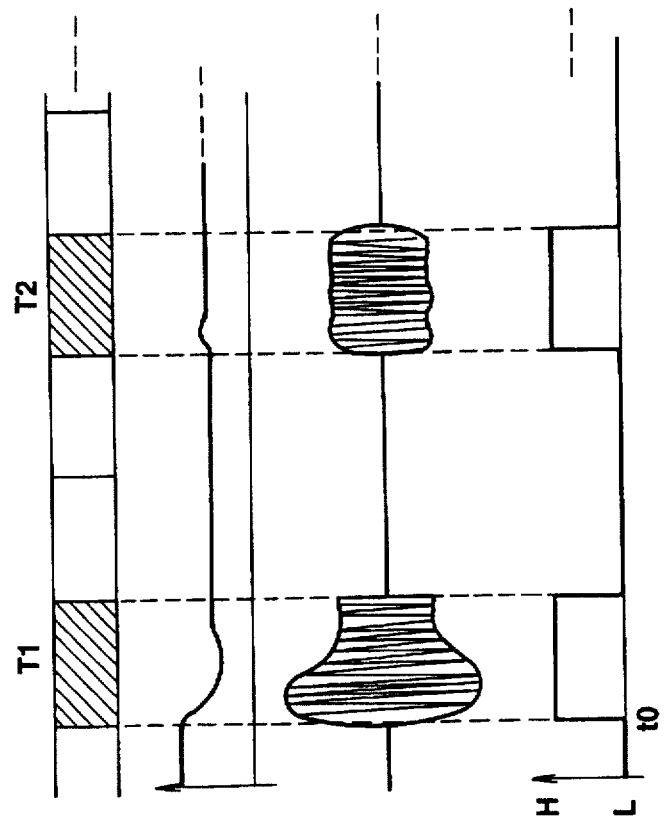
FIGS. 2(a)–(d) are timing charts for signals relating to operation of the structure shown in FIG. 1.
Figure 8:
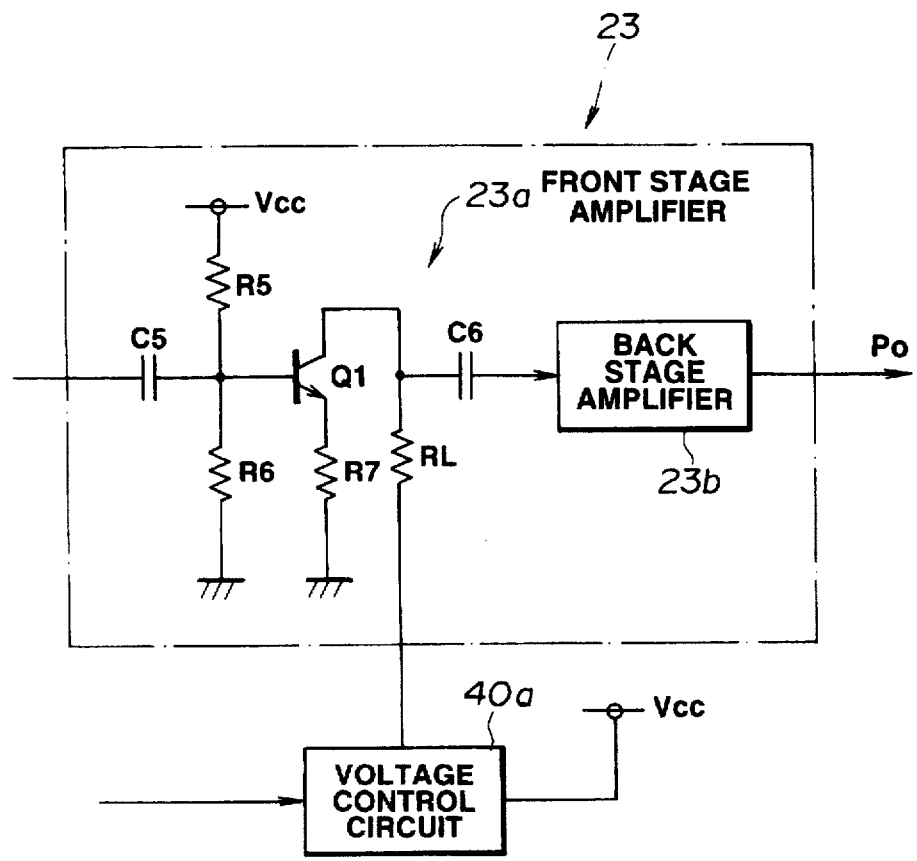
FIG. 8 is a block diagram showing, partially in a circuit form, a structure for controlling a collector voltage of a front stage amplifier in a power amplifier of in the third embodiment.

FIG. 8 is a block diagram showing a structure of the second embodiment. The structure of the second embodiment is identical to that of the first embodiment shown in FIG. 1 and 2 except that instead of the sample-hold circuit 11 of the first embodiment shown in FIG. 1, the former uses a discharging resistor R2 disposed between the stationary contact of the analog switch 34 and the ground.

In operation of the second embodiment, when a transmission is started or the transmission power is changed to a lower level, the switching control signal Cb from the controller 32 causes the capacitor C1 in the loop filter with hold function 29 to be grounded through the resistor R2. That is, the control terminal of the variable-gain circuit 22 is grounded to reduce the gain of the variable-gain circuit 22, which accordingly prevents the transmission power Po from overshooting. The other operation is the same as in the first embodiment.

Now, a third illustrative embodiment of the invention will be presented in the following.

Figure 7:
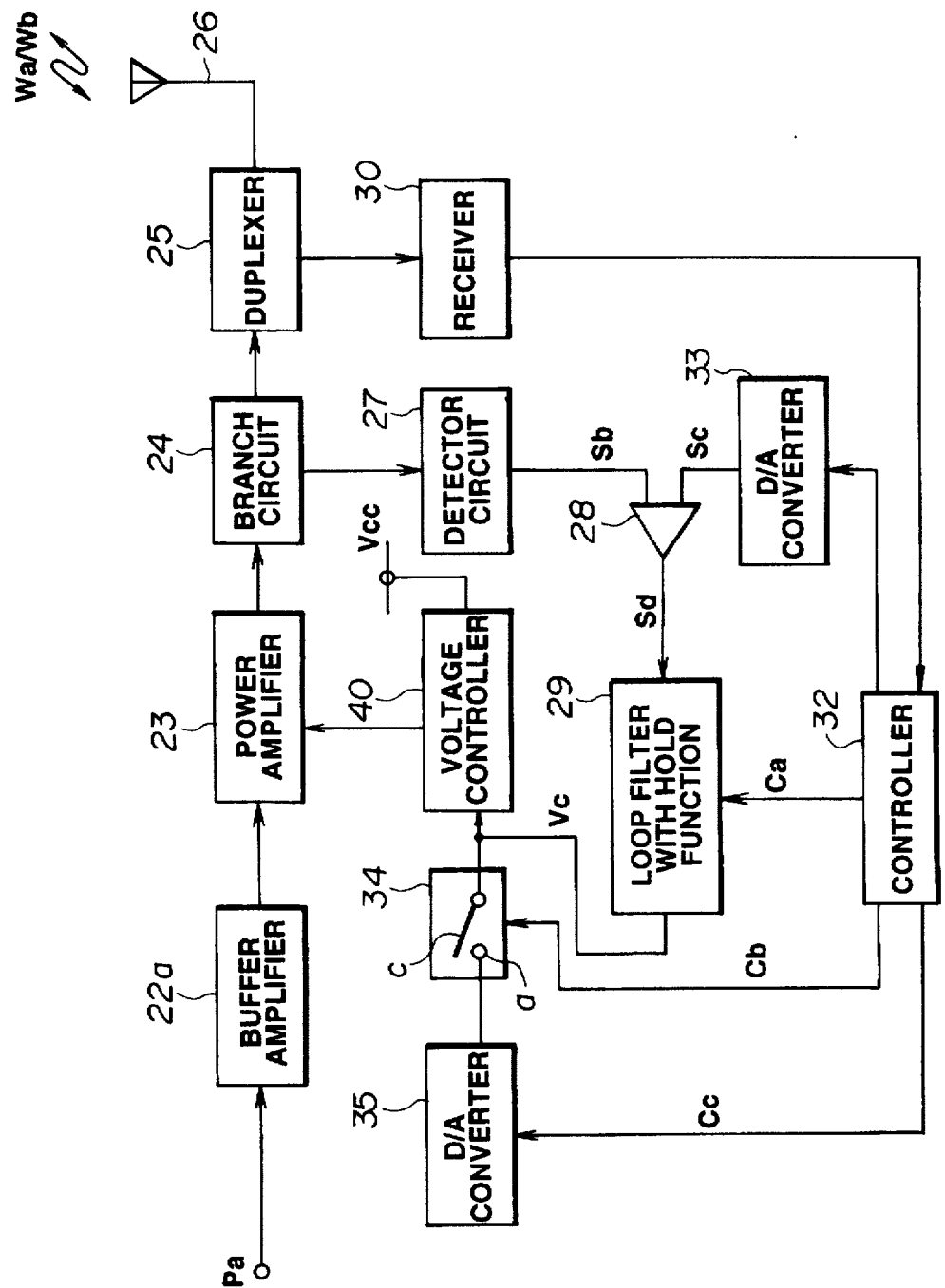
FIG. 7 a block diagram showing a structure of a third illustrative embodiment of the invention.
Figure 9:
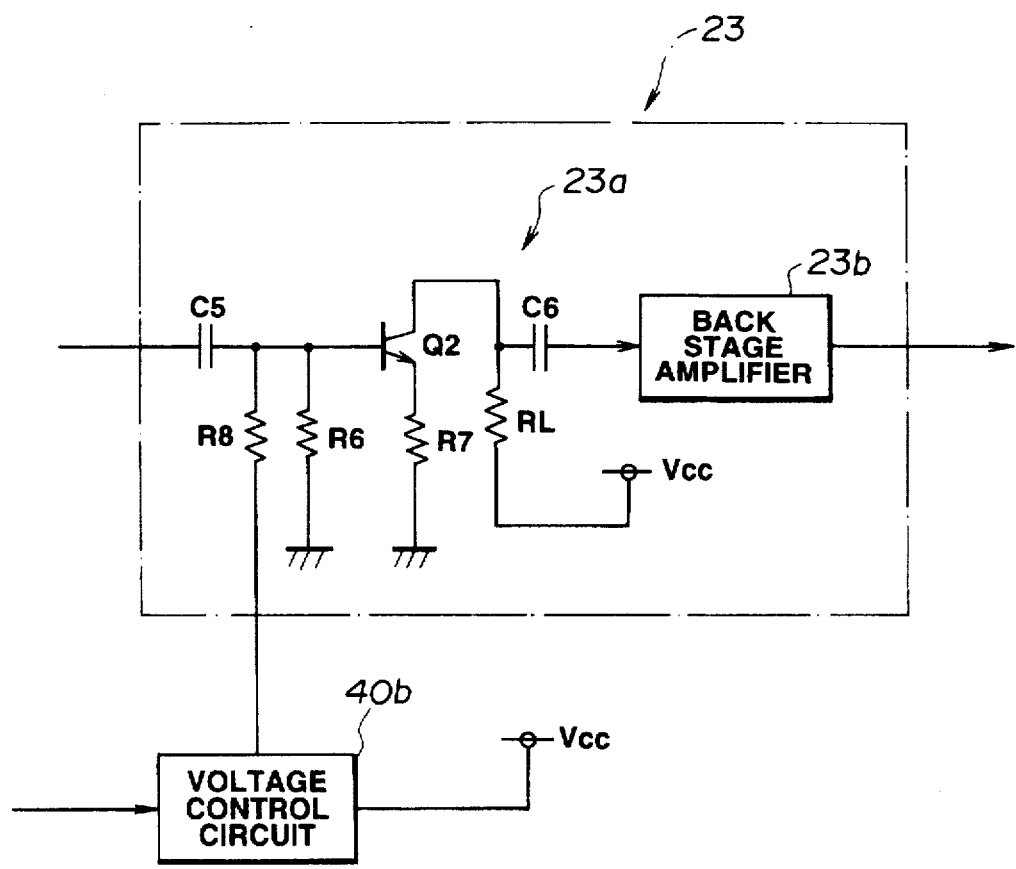
FIG. 9 is a block diagram showing, partially in a circuit diagram, a structure for controlling a base voltage in the third embodiment.

FIG. 7 is a block diagram showing a structure of the third embodiment. FIG. 8 is a block diagram showing, partly in a circuit form, a structure for controlling the collector voltage of a front stage amplifier in the power amplifier 23 of the third embodiment, while FIG. 9 is a block diagram showing, partially in a circuit form, a structure for controlling the base voltage of a front stage amplifier in the power amplifier 23 of the third embodiment. In the third illustrative embodiment as shown in FIG. 7, there is further provided a voltage controller 40 which is connected to the movable contact "c" of the analog switch 34 and to the power amplifier 23 together shown in FIG. 3, and the variable-gain circuit 22 has been replaced by a buffer amplifier 22a, which supplies a radio signal to the power amplifier 23. The rest of the structure of the embodiment is the same as that of FIG. 1 and 2.

In FIG. 8, the power amplifier 23 is provided with a front stage amplifier 23a comprising a transistor Q1, a load resistor RL, bias resistors RS and R6, an emitter resistor R7 and coupling capacitors C5 and C6, and a back stage amplifier 23b for supplying the transmission power Po. From the voltage controller 40a, a voltage is applied to the collector of the transistor Q1 through the load resistor RL.

Alternatively, as shown in FIG. 9, the power amplifier 23 may be provided with a front stage amplifier 23a comprising a transistor Q2, a load resistor RL, bias resistors R5 and R6, an emitter resistor R7 and a coupling capacitors C5, and a back stage amplifier 23b. Then, the transistor Q2 of the front stage amplifier 23a has a collector fed with a voltage through the load resistor RL and a base fed with a bias setting voltage from the voltage controller 40b through a resistor R8.

Operation of the structure of the third embodiment will be presented in the following.

Figure 5:
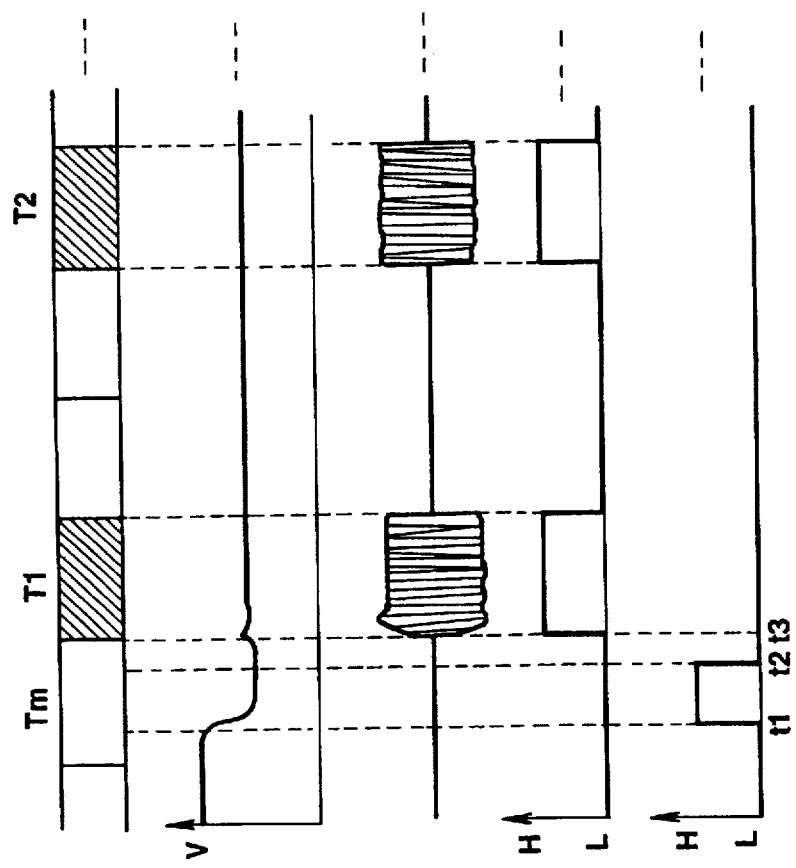
FIGS. 5(a)–(e) are timing charts for signals processed in operation of the structure of FIG. 1.

Through an arrangement shown in FIG. 8, the third embodiment operates in the same way as the embodiment shown in FIG. 3 and 5. Specifically, the voltage controller 40a, according to the transmission power controlling signal Vc input thereto, applies a voltage to the collector of the transistor Q1 through the load resistor RL. The transmission power Po from the power amplifier 23 (the back stage amplifier 23b) is set to a target value on the basis of the voltage, so that overshooting no longer occurs at the beginning of an active period of the transmission power Po as shown in FIG. 5(c).

Through an arrangement shown in FIG. 9, the third embodiment again operates in the same way as the embodiment shown in FIG. 3 and 5. Again, the voltage controller 40b, according to the transmission power controlling signal Vc input thereto, applies a voltage to the base of the transistor Q1 through the load resistor RL. The transmission power Po from the power amplifier 23 (the back stage amplifier 23b) is set to a target value on the basis of the voltage, so that overshooting no longer occurs at the beginning of an active period of the transmission power Po as shown in FIG. 5(c).

Figure 10:
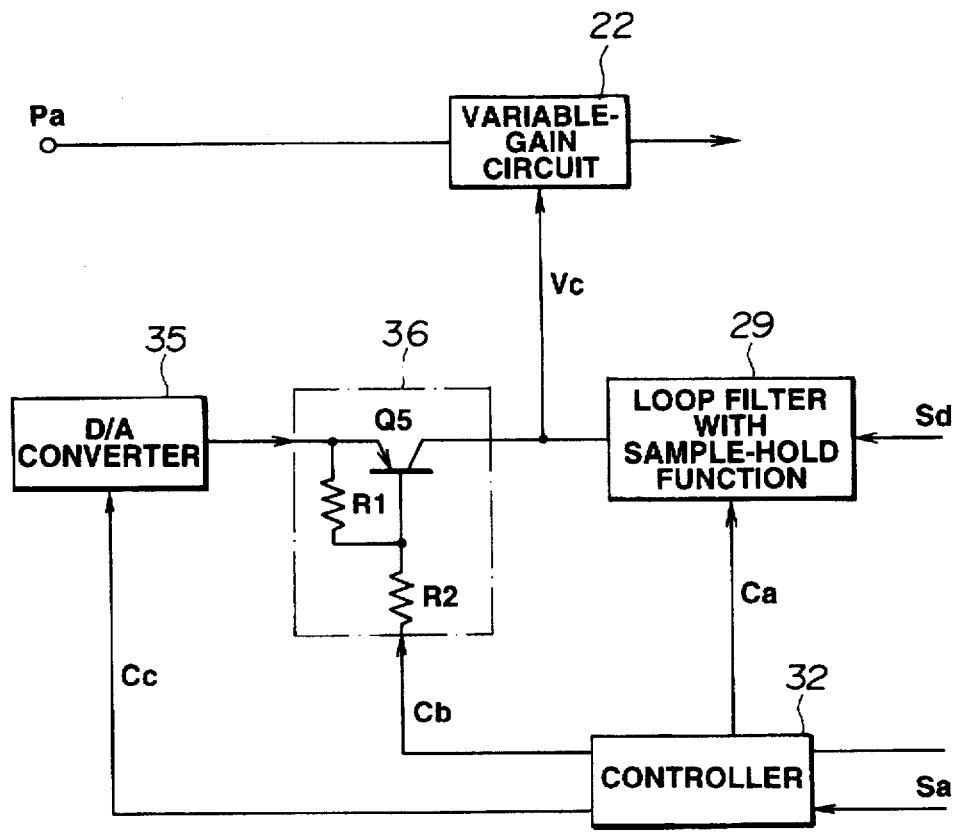
FIG. 10 is a circuit diagram showing a structure of a semiconductor switching circuit using a transistor in a fourth illustrative embodiment of the invention.
Figure 11:
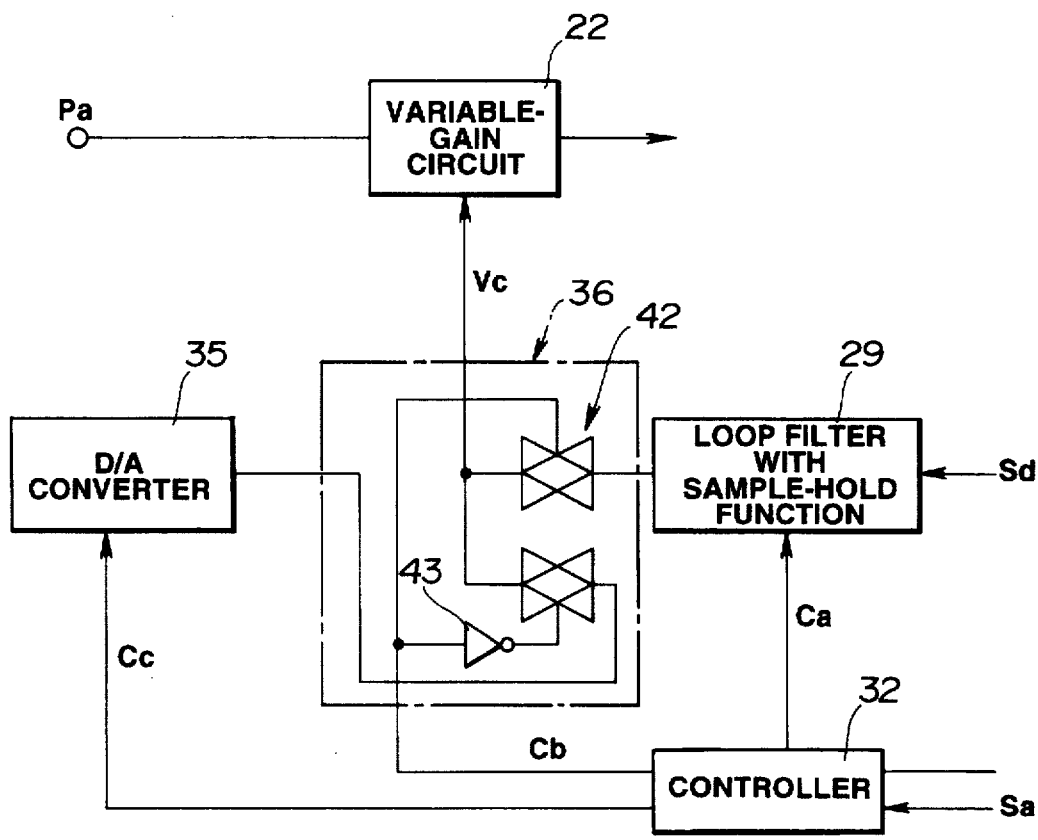
FIG. 11 is a circuit diagram showing a structure of a semiconductor switching circuit using a C-MOS analog switch device in the fourth illustrative embodiment of the invention.

FIG. 10 is a circuit diagram showing a structure of a semiconductor switching circuit used in a fourth illustrative embodiment of the invention and using a transistor instead of the analog switch shown in FIG. 3. FIG. 11 is a circuit diagram showing an alternative arrangement used in the fourth embodiment and using a CMOS analog switch device instead of the analog switch shown in FIG. 3.

The semiconductor switching circuit 36 shown in FIG. 10 comprises a transistor Q3 for switching (on and off), a resistor R1 connected between the base and the emitter of the transistor Q3 and a resistor R2 connecting the resistor R1 and the base of the transistor Q3 to the controller 32. Connected to the collector of the transistor Q3 are the output terminal of the loop filter with hold function 29 and the control terminal of the variable-gain circuit 22, so that the transmission power controlling signal Vc is supplied from the former to the latter. The emitter of the transistor Q3 is connected to the output terminal of the D/A converter 35, while the base of the transistor Q3 is connected to the controller 32, so that the switching control signal Cb is supplied from the controller 32 to the base.

As for the semiconductor switching circuit 36 shown in FIG. 11, output terminals of a CMOS analog switch device 42 are connected to the loop filter with hold function 29 and the control terminal of the variable-gain circuit 22 to supply the transmission power controlling signal Vc. An input terminal of the device 42 is connected to the D/A converter 35, while switching control terminals of the device 42 are connected directly and via an inverter to the controller 32 and accordingly supplied with the switching control signal Cb.

Operation of the fourth embodiment will be presented in the following.

In the semiconductor switching circuit 36 of FIG. 10, a high level switching control signal Cb from the controller 32 makes the transistor Q3 turn on (conductive). Operation of the fourth embodiment of this case is the same as that of the first embodiment shown in FIG. 3 and 5.

Also, in the semiconductor switching circuit 36 of FIG. 11, a high level switching control signal Cb from the controller 32 makes the CMOS analog switch 42 turn on (conductive). Operation of the fourth embodiment of this case is the same as that of the first embodiment shown in FIG. 3 and 5.

In the fourth embodiment, again, the transmission power Po from the power amplifier 23 is set to a target value on the basis of the voltage, so that overshooting no longer occurs at the beginning of an active period of the transmission power Po.

Now, a fifth illustrative embodiment of the invention will be presented in the following.

Figure 6:
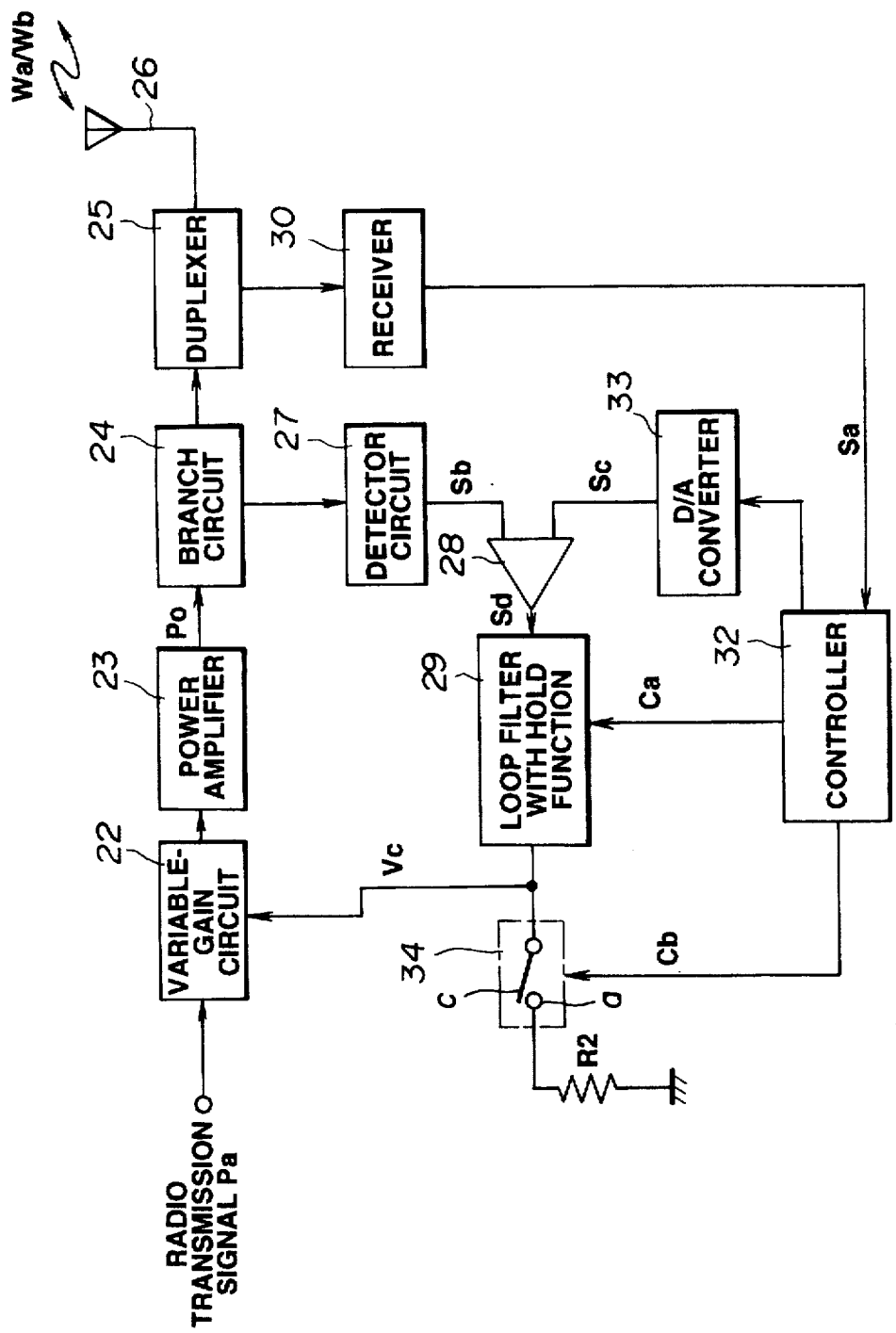
FIG. 6 a block diagram showing a structure of a second illustrative embodiment of the invention.
Figure 12:
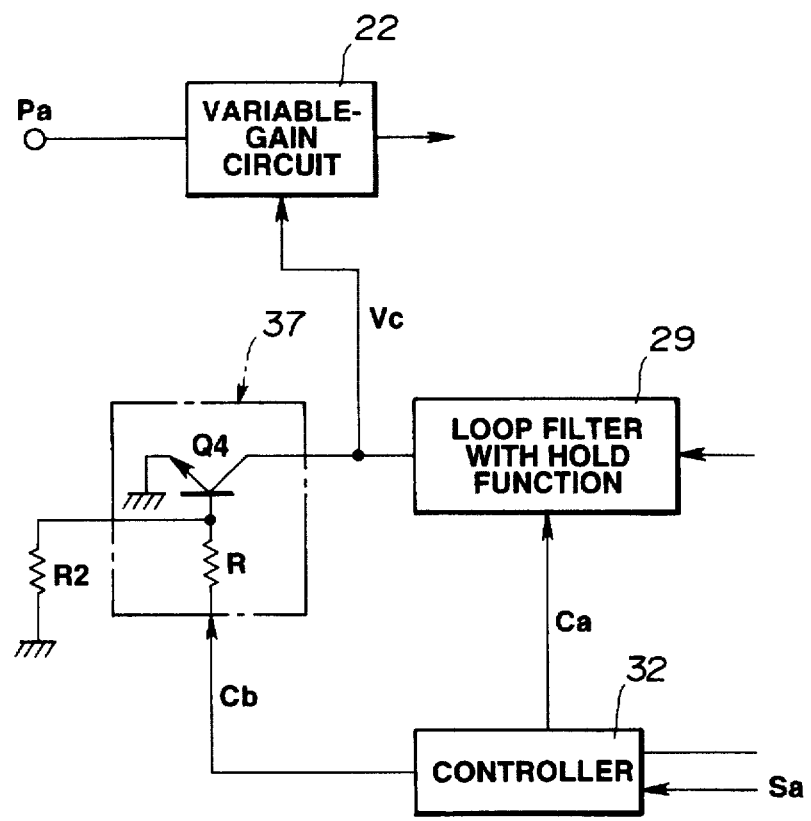
FIG. 12 is a circuit diagram showing a structure of a semiconductor switching circuit using a transistor in a fifth illustrative embodiment of the invention.
Figure 13:
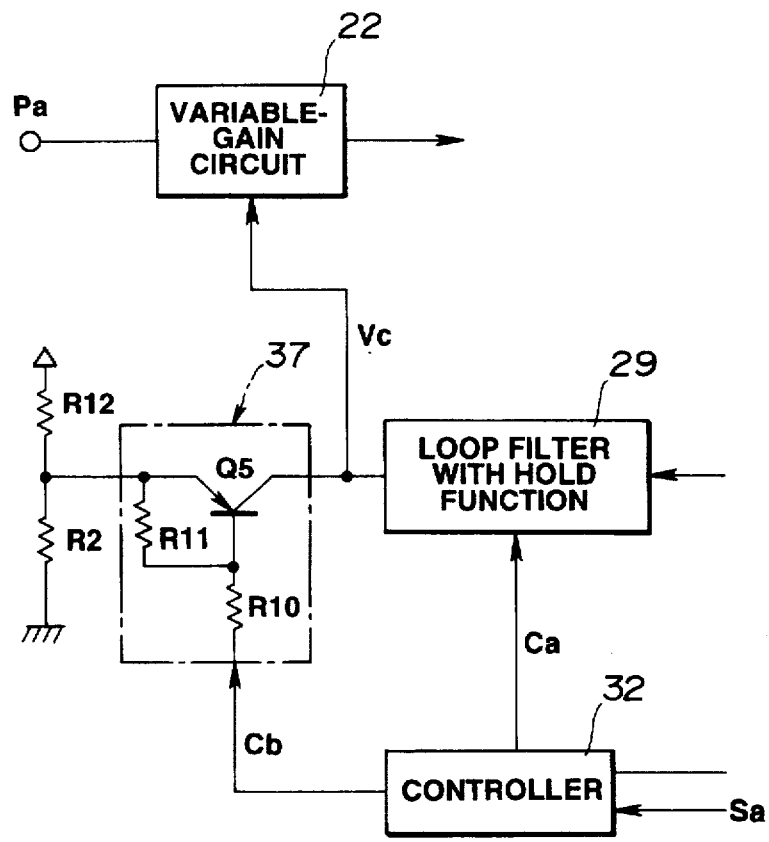
FIG. 13 is a block diagram showing a structure of a semiconductor switching circuit using a transistor with the different polarity in the fifth illustrative embodiment of the invention.

FIG. 12 is a circuit diagram showing a structure of a semiconductor switching circuit 37 using a transistor instead of the analog switch 34 shown in FIG. 6 and used in a fifth illustrative embodiment of the invention. FIG. 13 is a block diagram showing a structure of an alternative semiconductor switching circuit 37 using a transistor with the different polarity instead of the analog switch shown in FIG. 6 and used in the fifth embodiment.

Referring now to FIG. 12, the semiconductor switching circuit 37 comprises a PNP transistor Q4 for switching (on and off) and a resistor R connecting the controller 32 with the base of the transistor Q4 thereto to supply the switching control signal Cb. The transistor Q4 has its collector connected to both the control terminal of the variable-gain circuit 22 and the loop filter with hold function 29 so that the transmission power controlling signal Vc is supplied to the control terminal of the variable-gain circuit 22. Also, the transistor Q4 has its emitter grounded and its base grounded via a discharging resistor R2 (see FIG. 6).

Referring now to FIG. 13, the alternative semiconductor switching circuit 37 comprises a NPN transistor Q5 and a resistor R10 connecting the controller 32 with the base of the transistor Q5 thereto to supply the switching control signal Cb. The transistor Q5 has its collector connected to both the control terminal of the variable-gain circuit 22 and the loop filter with hold function 29 so that the transmission power controlling signal Vc is supplied to the control terminal of the variable-gain circuit 22. A bias resistor R11 is connected between the base and the emitter of the transistor Q5. Also, the transistor Q5 has its emitter connected to the power supply terminal via a resistor R12 and grounded via a discharging resistor R2 (see FIG. 6).

Operation of the fifth embodiment will be presented in the following.

In the semiconductor switching circuits 37 shown in FIG. 12 and 13, a high level switching control signal Cb causes the transistors Q4 and Q5 to turn on (conductive), which in turn causes the resistor R2 to be grounded. Specifically, when a transmission is started or the transmission power Po is changed to a lower level, at the beginning of the transmission time slot T1 shown in FIG. 5(a) through (e) the capacitor C1 in the loop filter with hold function 29 shown in FIG. 4 is grounded through the resistor R2 by means of the switching control signal Cb and at the same time the control terminal of the variable-gain circuit 22 is grounded. The operation in this case is the same as that of the first embodiment. Thus, in the fifth embodiment, again, the gain of the variable-gain circuit 22 is set low, so that overshooting no longer occurs at the beginning of an active period of the transmission power Po from the power amplifier 23.

Now, a sixth illustrative embodiment of the invention will be presented in the following.

Figure 14:
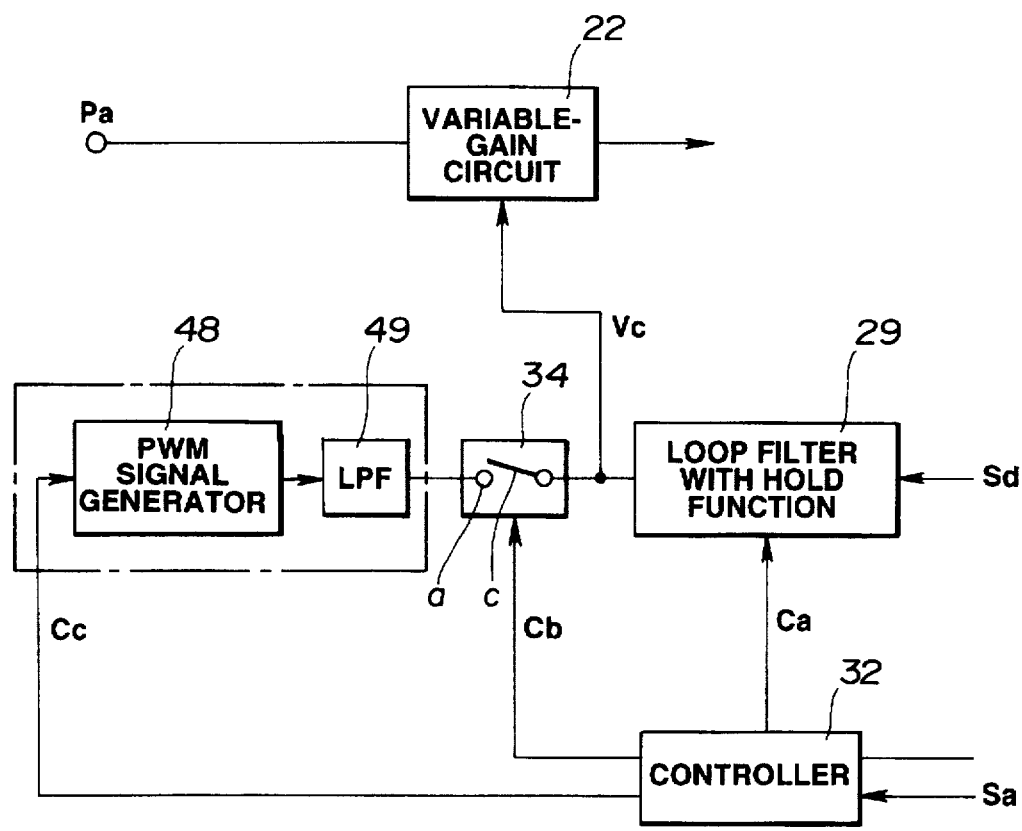
FIG. 14 is a block diagram showing a structure of a sixth illustrative embodiment of the invention in which a pulse width modulation signal generator and a low pass filter is used.

FIG. 14 is a block diagram showing a structure of the sixth embodiment. In this embodiment, the D/A converter shown in FIG. 3 is replaced by a PWM (pulse width modulation) signal generator and a low pass filter.

In FIG. 14, the PWM signal generator 48 generates a pulse width modulated signal based on the power setting signal Cc supplied from the controller 32 for setting the transmission power Po from the power amplifier 23 to a target value, and the low pass filter (LPF) 49 for smoothing and supplying the PWM signal to a stationary contact "a" of the analog switch 34. The rest of the structure of the embodiment is the same as the structure shown in FIG. 3.

Operation of the sixth embodiment will be presented in the following.

Figure 15:
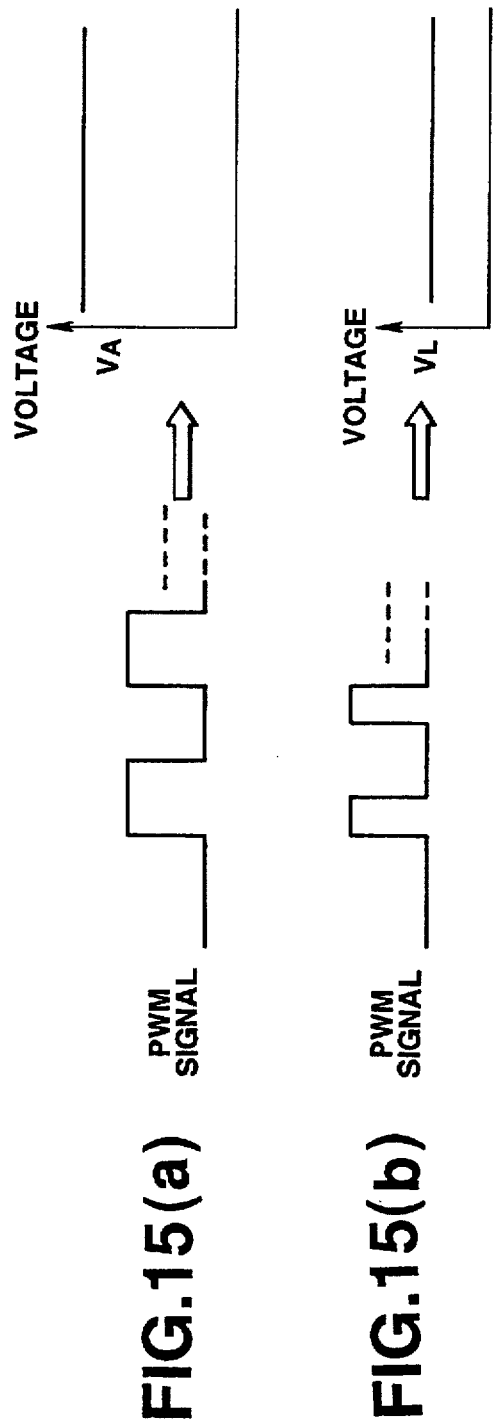
FIGS. 15(a)–(b) illustrate signals processed in operation of the sixth embodiment.

FIGS. 15(a)–(b) show how signals are processed by the PWM signal generator 48 and the LPF 49. In FIG. 14 and 15, the PWM signal generator 48 generates a pulse width modulated (PWM) signal as shown in FIGS. 15(a) or (b) on the basis of the power setting signal Cc from the controller 32. The PWM signal is made smooth by the LPF 49 to supply a DC voltage VH or VL as shown in FIG. 15(a) or (b) to the stationary contact "a" of the analog switch 34. The other operation of this embodiment is the same as the signal processing operation in FIG. 3 and 5. Thus, in the sixth embodiment, again, the gain of the variable-gain circuit 22 is set low, so that overshooting no longer occurs at the beginning of an active period of the transmission power Po from the power amplifier 23.

Now, a seventh illustrative embodiment of the invention will be presented in the following.

Figure 16:
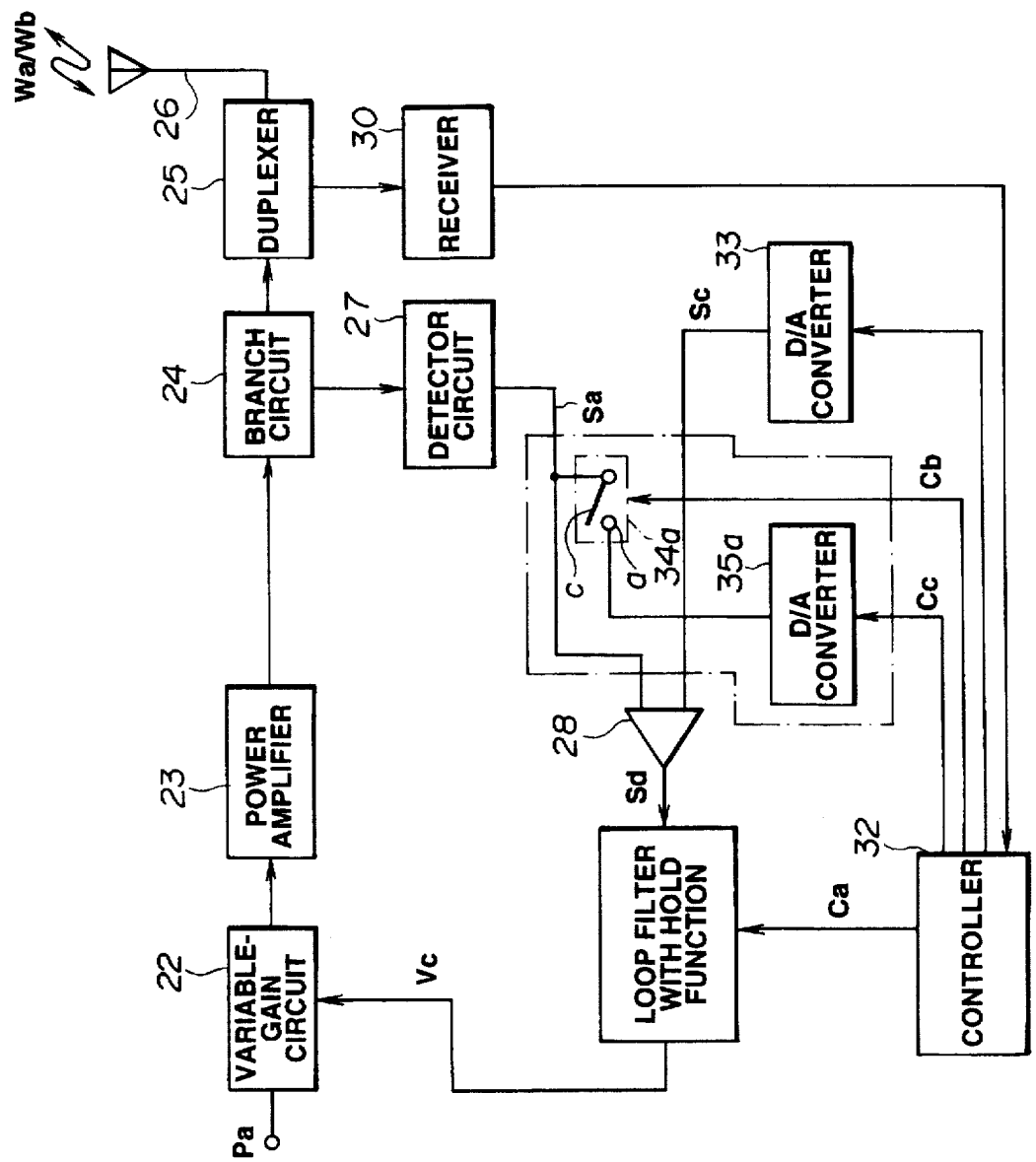
FIG. 16 is a block diagram showing a structure of a seventh illustrative embodiment of the invention in which an analog switch and a D/A converter are provided on the input side of the error amplifier.

FIG. 16. is a block diagram showing a structure of the seventh embodiment. In this embodiment, the analog switch 34 and the D/A converter 35 shown in FIG. 3 are disposed on the input side of the error amplifier 28. The detected signal Sa from the detector circuit 27 is input to the movable contact "c" of the analog switch 34a and one input terminal of the error amplifier 28. The stationary contact "a" of the analog switch 34a is connected to the output terminal of the D/A converter 35a.

Thus, basically operating like the first embodiment, the seventh embodiment controls the transmission power Po from the power amplifier 23 so that it does not overshoot. That is, the detected signal Sa from the detector circuit 27 is controlled so as not to cause the transmission power to increase at the initial stage of the first active period of the transmission power when a transmission is started or the transmission power is changed to a lower level.

Now, a eighth illustrative embodiment of the invention will be presented in the following.

Figure 17:
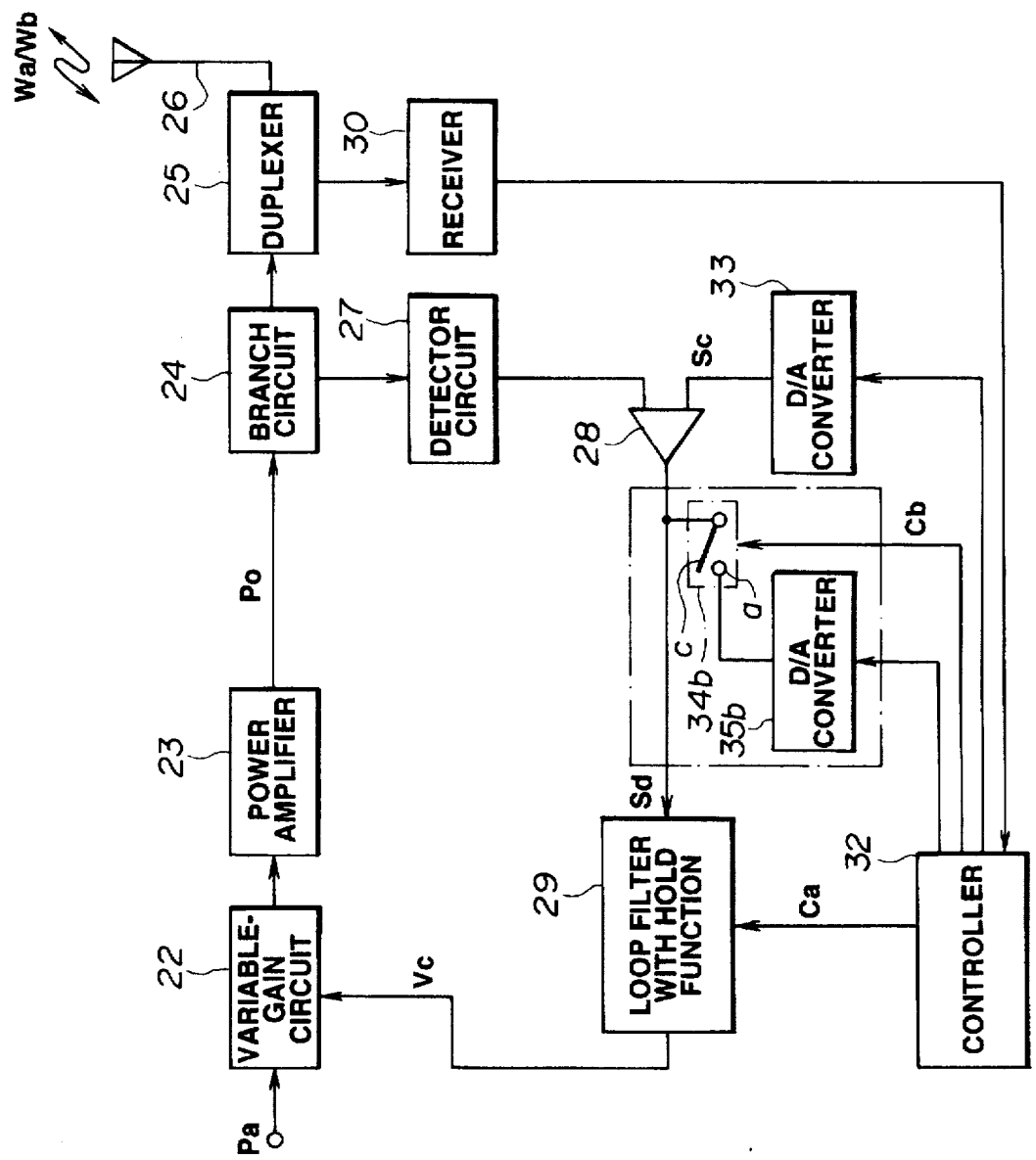
FIG. 17 is a block diagram showing a structure of an eighth illustrative embodiment of the invention in which an analog switch and a D/A-converter are provided on the output side of the error amplifier.

FIG. 17 is a block diagram showing a structure of an eighth illustrative embodiment of the invention. In this embodiment, the analog switch 34 and a D/A converter 35 shown in FIG. 3 are provided on the output side of the error amplifier 28. The difference signal Sd is supplied from the error amplifier 28 to the movable contact "c" of the analog switch 34b and the loop filter with hold function 29. The stationary contact "a" of the analog switch 34b is connected to the output terminal of the D/A converter 35b.

Thus, basically operating like the first embodiment shown in FIG. 3, the eighth embodiment controls the transmission power Po from the power amplifier 23 so that it does not overshoot. That is, the difference signal Sd from the error amplifier 28 is controlled so as not to cause the transmission power to increase at the initial stage of the first active period of the transmission power when a transmission is started or the transmission power is changed to a lower level.

Though the present invention has been described in terms of some illustrative embodiments, it is apparent to those of ordinary skill in the art that other various arrangements may be constructed without departing from the spirit and scope of the present invention. It should be therefore understand that the present invention is not limited to the specific embodiments described in the specification, but rather be construed broadly within its spirit and scope as defined by elements set out in the appended claims.

As described above, in a communications system according to the present invention, the transmission power is controlled not to increase at the initial stage of a first transmission slot when a transmission is started and when the transmission power is changed to a lower level. The transmission power is further controlled to maintain a level base on the reference voltage. For this reason, the transmission power is free from overshooting even at the beginning of transmission or at the time of changing transmission power to a lower level, permitting a low withstand power of the transmission power path. Further, an adverse effect on reception in other time slots can be checked which would be otherwise caused by an overshooting, providing an enhancement in the quality of communications.

CAPABILITY OF EXPLOITATION IN INDUSTRY

As described above, a communications system according to the present invention is very useful as a radio transmitting and receiving device in a digital mobile communications system.

I claim:

1. A radio communication apparatus transmitting a signal during a transmit period comprising:
    variable power amplifying means for producing transmission power in response to a control voltage;
    detecting means for detecting the level of the transmission power supplied from the variable power amplifying means;
    reference voltage generating means for generating a reference voltage for controlling the level of the transmission power from the variable power amplifying means;
    comparing means for comparing the detected level with the reference voltage to output a difference signal;
    control means for generating the control voltage to control an output level of the variable power amplifying means based on the difference signal sent from the comparing means, said control signal being output during the transmit period; and
    control voltage setting means for outputting a compensation signal through a closed loop including the variable power amplifying means, the detecting means, the comparing means, and the control means, so as to set the control voltage before a transmit period at such a value as not to increase a transmission power from the variable power amplifying means.

2. The radio communication apparatus according to claim 1, wherein the control voltage setting means outputs the compensation signal before the transmit period and at a time of transmission of the control voltage.

3. The radio communication apparatus according to claim 1 wherein the control voltage setting means provides the closed loop with the compensation signal before the transmit period.

4. The radio communication apparatus according to claim 1, wherein the control voltage setting means provides the input side of the comparing means with the compensating signal.

5. The radio communication apparatus according to claim 1, wherein the control voltage setting means provides the output side of the comparing means with the compensating signal.

6. The radio communication apparatus according to claim 1, wherein the variable power amplifying means comprises:
    a variable gain circuit having a gain that varies in response to the control signal; and
    a power amplifier for amplifying a radio frequency signal from the variable gain circuit.

7. The radio communication apparatus according to claim 1, wherein the variable power amplifying means comprises:
    a power amplifier having a plurality of amplifying transistor devices including a first stage amplifying transistor device and a last stage amplifying transistor device; and
    a voltage controlling circuit for receiving the control voltage from the control means at all times, receiving a signal representing a summation of the control voltage and the compensating signal before the transmit period, generating a corresponding voltage, and sending the corresponding voltage to a collector of the first stage amplifying transistor device.

8. The radio communication apparatus according to claim 7, wherein the power amplifier further includes a load resistor for picking up a radio frequency signal from the collector of the first stage amplifying transistor device; and
    wherein the voltage controlling circuit further includes means for changing a gain of the first stage amplifying transistor device by applying a voltage via the load resistor.

9. The radio communication apparatus according to claim 1, wherein the variable power amplifying means comprises:
    a power amplifier having a plurality of amplifying transistor devices including a first stage amplifying transistor device and a last stage amplifying transistor device; and
    a voltage controlling circuit for receiving the control voltage from the control means at all times, receiving a signal representing a summation of the control voltage and the compensating signal before the transmit period, generating a corresponding voltage, and sending the voltage to a base of the first stage amplifying transistor device.

10. The radio communication apparatus according to claim 9, wherein the power amplifier further including a resistor for applying a voltage to the base of the first stage amplifying transistor device to set a bias voltage; and
    wherein the voltage control circuit further includes means for changing a gain of the first stage amplifying device by applying a voltage to change the bias of the first stage amplifying device via the resistor.

11. The radio communication apparatus according to claim 1, wherein the control voltage setting means comprises:
    a digital-to-analog (D/A) converter for converting, into an analog voltage, data for setting the control voltage from the controlling means and supplying the analog
    a capacitor for being charged with and holding the analog voltage from the D/A converter; and
    a switching means for supplying the voltage from the capacitor as the control voltage to the variable power amplifying means before the transmit period.

12. The radio communication apparatus according to claim 1, wherein the control voltage setting means comprises:
    a pulse width modulator circuit for modulating data from the control means to a pulse width modulated signal;
    smoothing means for smoothing the pulse width modulated signal from the pulse width modulator;
    a capacitor for being charged with and holding the voltage from the smoothing means; and a switching means for supplying the voltage from the capacitor as the control voltage to the variable power amplifying means before the transmit period.

13. The radio communication apparatus according to claim 12, wherein the smoothing means comprises a low pass filter.

14. The radio communication apparatus according to claim 1, wherein the control voltage setting means comprises:

resistor grounding means for grounding the control terminal of the variable power amplifying means, to which a control voltage is applied, via a resistor before the transmit period.

15. The radio communication apparatus according to claim 1, wherein the control voltage setting means comprises:

resistor grounding means for grounding the control terminal of the variable power amplifying means, to which a control voltage is applied, via a resistor before the transmit period, and the resistor grounding means comprises:

an analog switch for performing a change operation to set a ground level to a control voltage given to the variable amplifying means from the control means; and switch controlling means for turning on the analog switch before the transmit period and turning it off for the transmit period.

16. The radio communication apparatus according to claim 15, wherein the analog switch is a CMOS analog switch for turning on and off under the control from a switch controlling means.

17. The radio communication apparatus according to claim 1, wherein the control voltage setting means comprises:

resistor grounding means for grounding the control terminal of the variable power amplifying means, to which a control voltage is applied, via a transistor before the transmit period;

a transistor switching circuit for performing a change operation to decide whether or not to give a signal to a control voltage fed to the variable power amplifying means from the control means; and switch controlling means for turning on the transistor switching circuit before the transmit period and turning it off for the transmit period.

18. The radio communication apparatus according to claim 1, wherein the control voltage setting means comprises:

resistor grounding means for grounding the control terminal of the variable power amplifying means, to which a control voltage is applied, via a resistor before the transmit period;

a digital-to-analog (D/A) converter for converting, into an analog voltage, data for setting the control voltage from the control means and supplying the analog voltage, and the resistor grounding means comprises:

a transistor switching circuit for performing a change operation to decide whether or not to give a signal to a control voltage fed to the variable power amplifying means from the control means; and switch controlling means for turning on the transistor switching circuit before the transmit period and turning the transistor switching circuit off for the transmit period, and the transistor switching circuit includes:

a PNP transistor having a base for receiving a control signal from the switch controlling means, an emitter for receiving an analog signal from the D/A converter, and a collector for supplying a control voltage to the variable power amplifying means.

19. The radio communication apparatus according to claim 1, wherein the control voltage setting means comprises:

a digital-to-analog (D/A) converter for converting, into an analog voltage, data for setting the control voltage from the control means and supplying the analog voltage; and a switch for controlling passage of the difference signal from the comparing means;

a resistor serially connected to the input terminal of the switch and a capacitor, connected between the output terminal of the switch and the ground, for acting with the resistor as a filter when the switch passes the difference signal, and for holding the voltage from the D/A converter when the switch does not pass the difference signal.

20. The radio communication apparatus according to claim 1, wherein the control voltage setting means comprises:

a digital-to-analog (D/A) converter for converting, into an analog voltage, data for setting the control voltage from the control means and supplying the analog voltage;

a first switch for controlling passage of the difference signal from the comparing means;

a resistor serially connected to the input terminal of the first switch, to which the difference signal is applied;

a capacitor connected between the output terminal of the first switch and ground and operative in case of the conductive state of the first switch for acting with a resistor as a filter and in case of the nonconductive state of the first switch for holding the voltage from the D/A converter;

a second switch operative in case of the nonconductive state of the first switch for turning on to applying the voltage from the D/A converter to the capacitor; and switch controlling means for turning the first switch off and the second switch on before the transmit period, and turning the first switch on and the second switch off during the transmit period.

21. The radio communication apparatus according to claim 1, wherein the control voltage setting means comprises:

a digital-to-analog (D/A) converter for converting, into an analog voltage, data for setting the control voltage from the control means and supplying the analog voltage;

a first switch for passing the difference signal from the comparing means;

a resistor serially connected to the input terminal of the first switch, to which the difference signal is applied;

a capacitor connected to between the output terminal of the first switch and ground and operative in case of the conductive state of the first switch for acting with a resistor as a filter and in case of the nonconductive state of the first switch for holding the voltage from the D/A converter;

a second switch operative in case of the nonconductive state of the first switch for applying the voltage from the D/A converter to the capacitor; and switch controlling means for turning the first switch off and the second switch on before the transmit period, and turning the first switch on and the second switch off during the transmit period, wherein the second switch comprises:

an analog switch for turning on and off under the control from the switch controlling means.

22. The radio communication apparatus according to claim 1, wherein the control voltage setting means comprises:

a digital-to-analog (D/A) converter for converting, into an analog voltage, data for setting the control voltage from the control means and supplying the analog voltage;

a first switch for passing the difference signal from the comparing means;

a resistor serially connected to the input terminal of the first switch, to which the difference signal is applied;

a capacitor connected between the output terminal of the first switch and ground and operative in case of the conductive state of the first switch for acting with a resistor as a filter and in case of the nonconductive state of the first switch tor holding the voltage from the D/A converter;

a second switch operative in case of the nonconductive state of the first switch for applying the voltage from the D/A converter to the capacitor; and switch controlling means for turning the first switch off and the second switch on before the transmit period, and turning the first switch on and the second switch off during the transmit period, wherein the second switch comprises:

a transistor switching circuit for turning on and off under the control of the switch controlling means.

23. The radio communication apparatus according to claim 1, transmitting a signal for a transmit period comprising:

a digital-to-analog (D/A) converter for converting, into an analog voltage, data for setting the control voltage from the control means and supplying the analog voltage;

a first switch for passing the difference signal from the comparing means;

a resistor serially connected to the input terminal of the first switch, to which the difference signal is applied;

a capacitor connected between the output terminal of the first switch and ground and operative in case of the conductive state of the first switch for acting with a resistor as a filter and in case of the nonconductive state of the first switch for holding the voltage from the D/A converter;

a second switch operative in case of the nonconductive state of the first switch for applying the voltage from the D/A converter to the capacitor; and switch controlling means for turning the first switch off and the second switch on before the transmit period, and turning the first switch on and the second switch off during the transmit period, wherein the second switch comprises:

a transistor switching circuit for turning on and off under the control from the switch controlling means, and the transistor switching circuit comprises:

a PNP transistor having a collector connected to a control terminal of the variable power amplifying means, a base fed with a control signal from the switch controlling means, and an emitter connected to a resistor which is grounded.

24. The radio communication apparatus according to claim 1, wherein the control voltage setting means comprises:

a digital-to-analog (D/A) converter for converting, into an analog voltage, data for setting the control voltage from the control means and supplying the analog voltage;

a first switch for passing the difference signal from the comparing means;

a resistor serially connected to an input terminal of the first switch, to which the difference signal is applied;

a capacitor connected between the output terminal of the first switch and ground and operative in case of the conductive state of the first switch for acting with the resistor as a filter and in case of the nonconductive state of the first switch for holding the voltage from the D/A converter;

a second switch operative in case of the nonconductive state of the first switch for applying the voltage from the D/A converter to the capacitor; and switch controlling means for turning the first switch off and the second switch on before the transmit period, and turning the first switch on and the second switch off during the transmit period, wherein the second switch comprises:

a transistor switching circuit for turning on and off under the control of the switch controlling means, wherein the transistor switching circuit comprises:

a PNP transistor having a collector connected to a control terminal of the variable power amplifying means, a base fed with a control signal from the switch controlling means, and an emitter connected to a power supply and a resistor which is grounded.

25. The radio communication apparatus according to claim 1, wherein the control voltage setting means comprises:

a D/A converter for converting, into an analog voltage, data for setting the control voltage from the control means and supplying the analog voltage;

a first switch for passing the difference signal from the comparing means;

a resistor serially connected to the input terminal of the first switch, to which the difference signal is applied;

a capacitor connected between an output terminal of the first switch and ground and operative in case of the conductive state of the first switch for acting with a resistor as a filter and in case of the nonconductive state of the first switch for holding the voltage from the D/A converter;

a second switch operative in case of the nonconductive state of the first switch for applying the voltage from the D/A converter to the capacitor; and switch controlling means for turning the first switch off and the second switch on before the transmit period, and turning the first switch on and the second switch off during the transmit period, wherein the second switch comprises:

a CMOS analog switch for turning on and off under the control of the switch controlling means.

26. The radio communication apparatus according to claim 1, wherein the reference voltage generating means comprises:

extracting means for extracting information specifying the level of the transmission power from a base station and generating the reference voltage.

27. The radio communication apparatus according to claim 1, wherein the reference voltage generating means comprises:

extracting means for extracting information specifying the level of the transmission power from a base station and sending the resultant digital signal;

a digital-to-analog (D/A) converter for converting the digital data from the extracting means to an analog signal and for supplying the resultant signal as the reference voltage to the comparing means.

28. A radio communication apparatus transmitting a signal during a transmit period comprising:

variable power amplifying means for producing transmission power in response to a control voltage;

detecting means for detecting the level of the transmission power supplied from the variable power amplifying means;

reference voltage generating means for generating a reference voltage for controlling the level of the transmission power from the variable power amplifying means;

comparing means for comparing the detected level with the generated level so as to output a difference signal;

means for generating a predetermined voltage signal; and control means for outputting the control voltage in response to the generated predetermined voltage signal before the transmit period and for outputting the control voltage in response to the outputted difference signal during the transmit period.

* * * * *

UNITED STATES PATENT AND TRADEMARK OFFICE
CERTIFICATE OF CORRECTION

PATENT NO.  : 5,737,697
DATED       : April 07, 1998
INVENTOR(S) : Tatsuya YAMADA It is certified that error appears in the above-indentified patent and that said Letters Patent is hereby corrected as shown below:

In Claim 11, Column 12, line 53, after "analog", insert --voltage;--.

In Claim 22, Column 15, line 15, "tor" should read --for--.

Signed and Sealed this

Twenty-third Day of March, 1999

Attest:

Attesting Officer

Q. TODD DICKINSON

Acting Commissioner of Patents and Trademarks